(12) United States Patent
Amano

(10) Patent No.: US 11,574,815 B1
(45) Date of Patent: Feb. 7, 2023

(54) METHOD OF MANUFACTURING SEMICONDUCTOR DEVICE

(71) Applicant: Kokusai Electric Corporation, Tokyo (JP)

(72) Inventor: Tomihiro Amano, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 17/669,339

(22) Filed: Feb. 10, 2022

(30) Foreign Application Priority Data

Sep. 1, 2021 (JP) .............................. JP2021-142399

(51) Int. Cl.
*H01L 21/324* (2006.01)
*C23C 16/46* (2006.01)
*C23C 16/44* (2006.01)

(52) U.S. Cl.
CPC ........ *H01L 21/324* (2013.01); *C23C 16/4405* (2013.01); *C23C 16/46* (2013.01)

(58) Field of Classification Search
CPC ......... H01L 21/02334; H01L 21/02205; H01L 21/02186; H01L 21/285; H01L 21/324; C23C 16/4405; C23C 16/46
See application file for complete search history.

(56) References Cited

U.S. PATENT DOCUMENTS

| 2011/0061810 | A1* | 3/2011 | Ganguly | ........... H01L 21/67167 156/345.27 |
| 2012/0034570 | A1 | 2/2012 | Yasui et al. | |
| 2015/0152554 | A1* | 6/2015 | Saido | .................. C23C 16/4408 118/724 |
| 2017/0183775 | A1* | 6/2017 | Yamamoto | .......... C23C 16/4557 |

FOREIGN PATENT DOCUMENTS

JP 2012-54536 A 3/2012

* cited by examiner

*Primary Examiner* — Brook Kebede
(74) *Attorney, Agent, or Firm* — Edell, Shapiro & Finnan, LLC

(57) ABSTRACT

According to one aspect of the technique, there is provided a method of manufacturing a semiconductor device, including: (a) heating a substrate to a first temperature while supporting the substrate on a substrate support, and supplying a process gas into a process vessel accommodating the substrate support; (b) lowering a temperature of a low temperature structure provided in the process vessel to a second temperature lower than the first temperature by supplying an inert gas or air to a coolant flow path provided in the process vessel after (a) for a predetermined time, wherein defects occur when a cleaning gas is supplied to the low temperature structure at the first temperature; and (c) cleaning the low temperature structure by supplying the cleaning gas into the process vessel after (b).

20 Claims, 5 Drawing Sheets

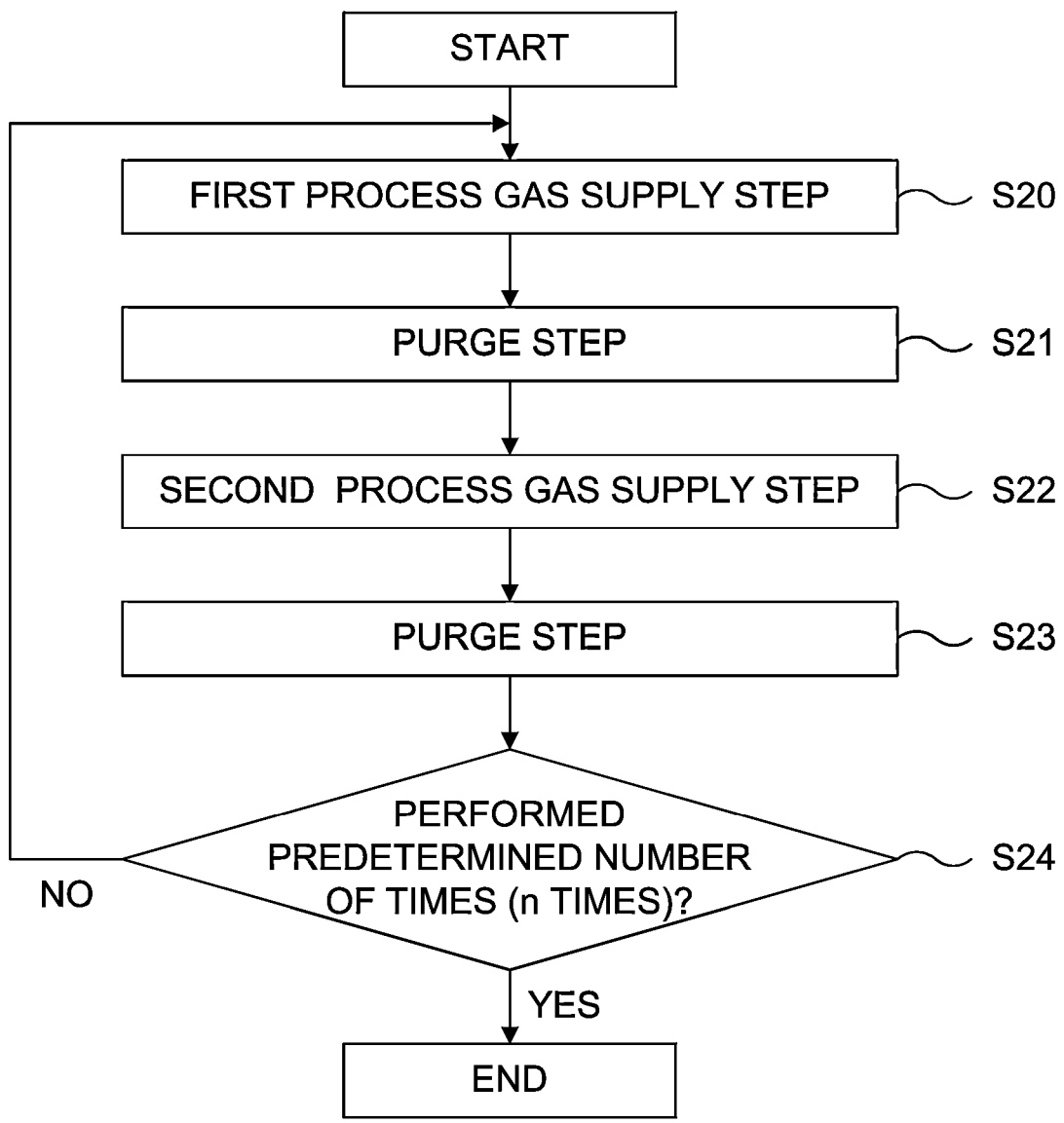

METHOD OF MANUFACTURING SEMICONDUCTOR DEVICE

CROSS REFERENCE TO RELATED APPLICATIONS

This application claims foreign priority under 35 U.S.C. § 119(a)-(d) to Application No. JP 2021-142399 filed on Sep. 1, 2021, the entire contents of which are hereby incorporated by reference.

TECHNICAL FIELD

The present disclosure relates to a method of manufacturing a semiconductor device.

BACKGROUND

According to some related arts, as a part of a manufacturing process of a semiconductor device, a process gas is supplied to a substrate in a process vessel to process a film on the substrate (that is, to perform a film process).

When the film process is performed using a substrate processing apparatus according to some related arts, deposits may adhere to an inside of the process vessel of the substrate processing apparatus. Therefore, after the film process, a cleaning process may be performed in which a cleaning gas is supplied into the process vessel to remove the deposits adhering to the inside of the process vessel.

However, when the cleaning process is performed at a high temperature after the film process is performed at a high temperature, defects may occur in some locations. Therefore, it is preferable to lower an inner temperature of the process vessel to a desired temperature before performing the cleaning process after the film process. However, in such a case, a downtime of the substrate processing apparatus may increase and an operating rate of the substrate processing apparatus may be affected.

SUMMARY

According to the present disclosure, there is provided a technique capable of shortening a downtime of a substrate processing apparatus and improving an operating rate of the substrate processing apparatus.

According to one or more embodiments of the present disclosure, there is provided a technique related to a method of manufacturing a semiconductor device, including: (a) heating a substrate to a first temperature while supporting the substrate on a substrate support, and supplying a process gas into a process vessel accommodating the substrate support; (b) lowering a temperature of a low temperature structure provided in the process vessel to a second temperature lower than the first temperature by supplying an inert gas or air to a coolant flow path provided in the process vessel after (a) for a predetermined time, wherein defects occur when a cleaning gas is supplied to the low temperature structure at the first temperature; and (c) cleaning the low temperature structure by supplying the cleaning gas into the process vessel after (b).

BRIEF DESCRIPTION OF THE DRAWINGS

FIG. 5 is a flowchart schematically illustrating a film-forming step of the substrate processing according to the embodiments of the present disclosure.

DETAILED DESCRIPTION

Embodiments

Figure 1:
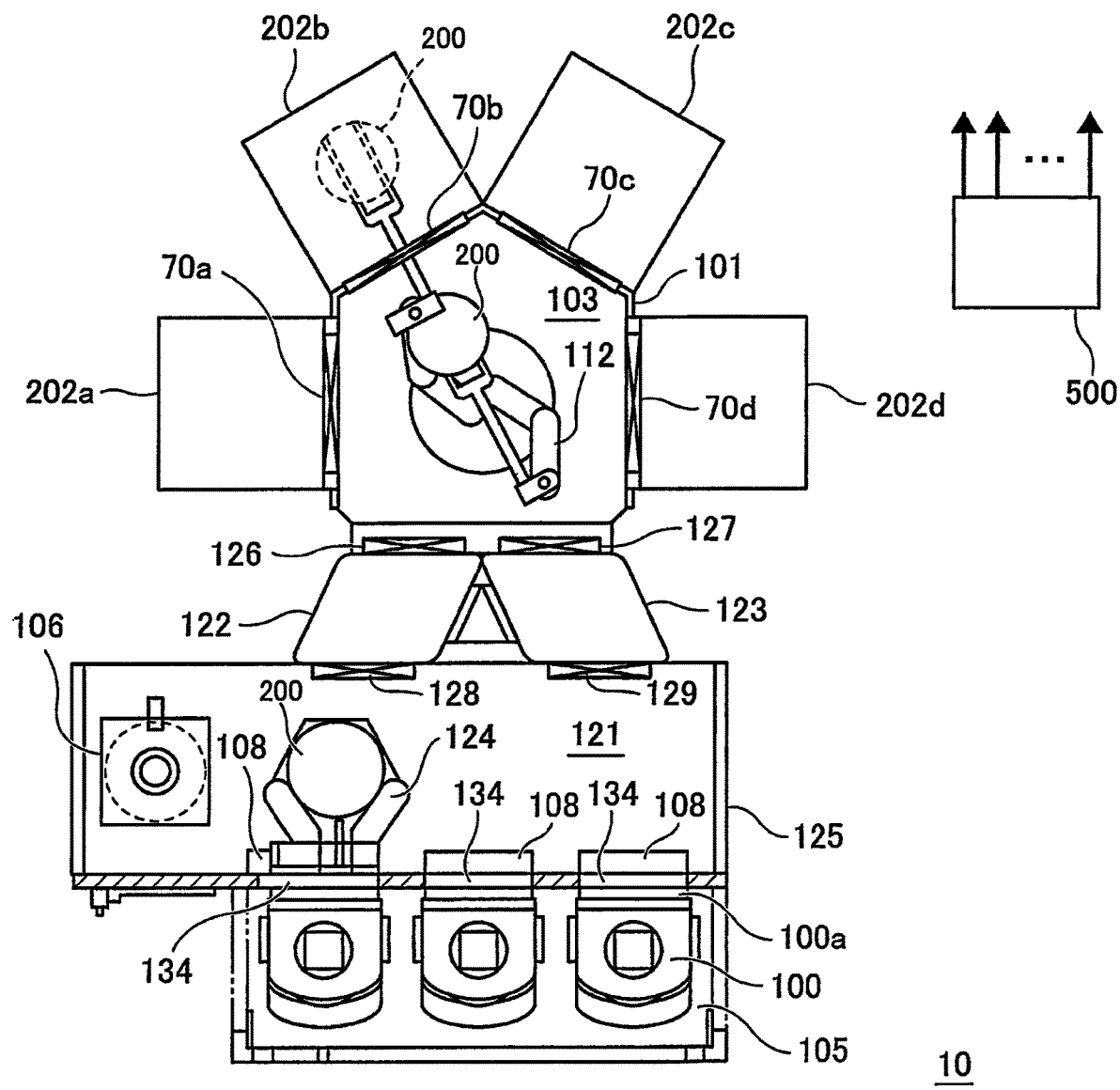
FIG. 1 is a diagram schematically illustrating an exemplary configuration of a substrate processing apparatus according to one or more embodiments of the present disclosure.

Hereinafter, one or more embodiments (also simply referred to as "embodiments") according to the technique of the present disclosure will be described with reference to the drawings. Like reference numerals represent like components in the drawings, and redundant descriptions related thereto will be omitted. In the drawings, for the sake of convenience of the descriptions, features such as width, thickness and shape of each component may be schematically illustrated as compared with actual structures. However, the drawings are merely examples of the embodiments, and the embodiments according to the technique of the present disclosure are not limited thereto.

(1) Configuration of Substrate Processing Apparatus

FIG. 1 is a diagram schematically illustrating a cross-section of a single wafer type substrate processing apparatus (hereinafter, also simply referred to as a "substrate processing apparatus") 10 of performing a method of manufacturing a semiconductor device when viewed from above. A transfer device of the substrate processing apparatus 10 of a cluster type according to the present embodiments is divided into a vacuum side and an atmospheric side. In addition, in the substrate processing apparatus 10, a FOUP (Front Opening Unified Pod, hereinafter, also referred to as a "pod") 100 is used as a carrier for transferring a wafer 200 serving as a substrate.

Configuration of Vacuum Side

As shown in FIG. 1, the substrate processing apparatus 10 includes a first transfer chamber 103 capable of withstanding a pressure (negative pressure) below the atmospheric pressure such as a pressure in a vacuum state. For example, a housing 101 of the first transfer chamber 103 is pentagonal when viewed from above. The housing 101 is of a box shape with closed upper and lower ends.

In the first transfer chamber 103, a first substrate transfer device 112 configured to transfer the wafer 200 is installed.

Auxiliary chambers (which are load lock chambers) 122 and 123 are connected to a side wall among five sidewalls of the housing 101 that is located on a front side (lower side in FIG. 1) of the housing 101 via gate valves 126 and 127, respectively. The auxiliary chambers 122 and 123 are capable of withstanding the negative pressure. The wafer 200 can be transferred (loaded) into or transferred (unloaded) out of the auxiliary chambers 122 and 123.

A process vessel 202a serving as a part of a process module PM1, a process vessel 202b serving as a part of a process module PM2, a process vessel 202c serving as a part of a process module PM3 and a process vessel 202d serving as a part of a process module PM4, which are configured to perform a desired (predetermined) processing on the wafer 200, are connected adjacently to the four sidewalls (among the five sidewalls) of the housing 101 that are located on a rear side (back side) (upper side in FIG. 1) of the housing 101 of the first transfer chamber 103 with a gate valve 70a, a gate valve 70b, a gate valve 70c and a gate valve 70d interposed therebetween, respectively.

Configuration of Atmospheric Side

A second transfer chamber 121 wherein the wafer 200 can be transferred under the atmospheric pressure is connected to front sides of the auxiliary chambers 122 and 123 via a gate valve 128 and a gate valve 129. In the second transfer chamber 121, a second substrate transfer device 124 configured to transfer the wafer 200 is installed.

A notch aligner 106 is installed on a left side of the second transfer chamber 121. The notch aligner 106 may be an orientation flat aligner.

A substrate loading/unloading port 134 and a pod opener 108 are installed at a front side of a housing 125 of the second transfer chamber 121 to load the wafer 200 into or unload the wafer 200 out of the second transfer chamber 121. A loading port structure (which is an I/O stage) 105 is installed opposite to the pod opener 108 with the substrate loading/unloading port 134 interposed therebetween. That is, the loading port structure 105 is installed outside the housing 125. The pod opener 108 is configured to open and close a cap 100a of the pod 100. The pod opener 108 includes a closure (not shown) capable of opening and closing the substrate loading/unloading port 134. When the cap 100a of the pod 100 placed on the loading port structure 105 is opened or closed, the wafer 200 may be loaded into the pod 100 or unloaded out of the pod 100. In addition, the pod 100 is loaded onto or unloaded out of the loading port structure 105 by an in-step transfer device (not shown) such as an OHT (Overhead Hoist Transfer).

(2) Configuration of Process Module

Subsequently, configurations of the process vessels 202a through 202d of the process modules PM1 through PM4 will be described.

Each of the process modules PM1 through PM4 functions as a part of the single wafer type substrate processing apparatus. The process modules PM1 through PM4 are provided with the process vessels 202a through 202d, respectively. Since the configurations of the process vessels 202a through 202d are substantially the same for the process modules PM1 through PM4, a process vessel 202 among the process vessels 202a through 202d will be described in detail below. That is, the process vessels 202a through 202d may be individually referred to as the process vessel 202.

Figure 2:
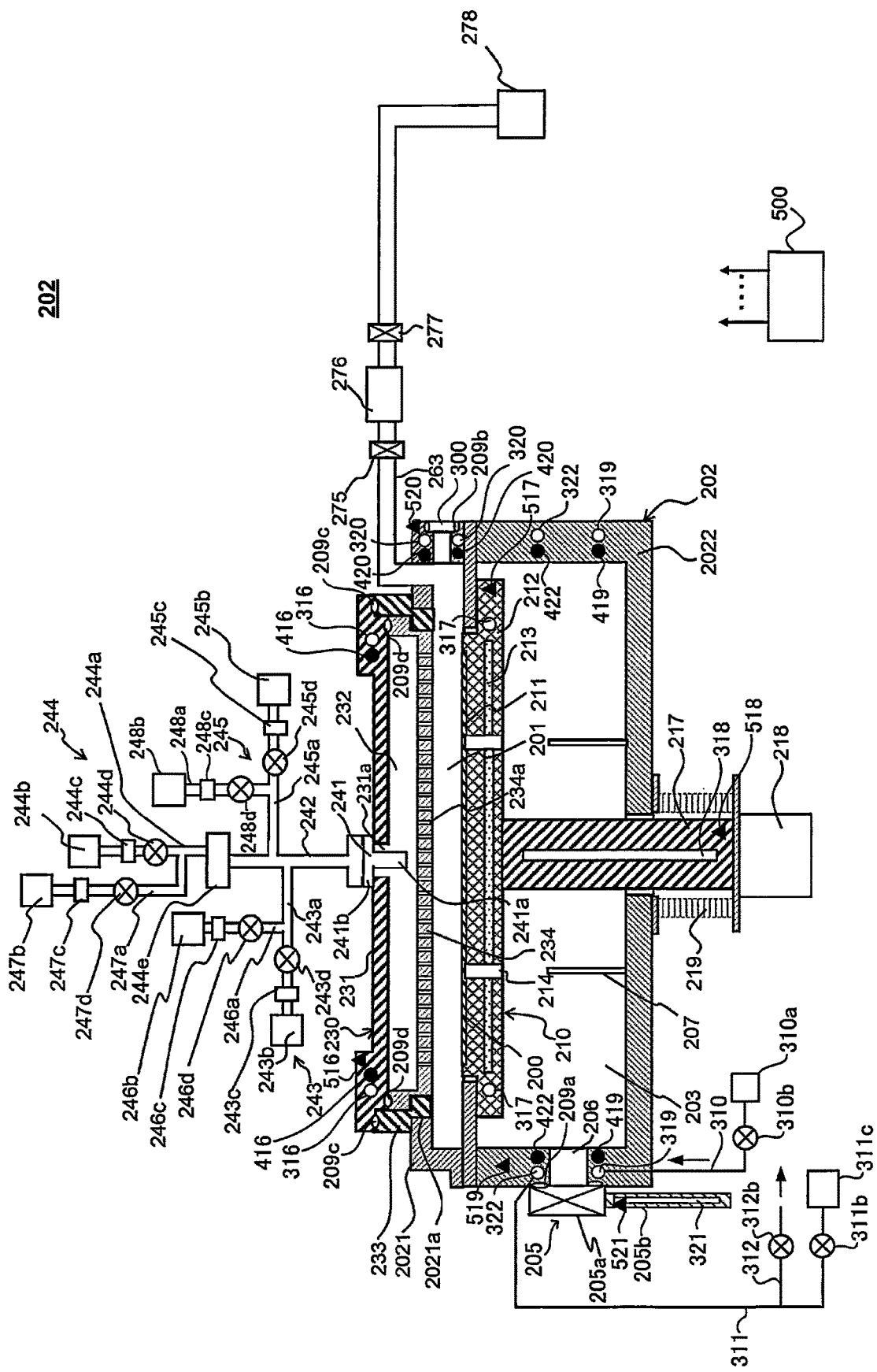
FIG. 2 is a diagram schematically illustrating an exemplary configuration of a process vessel of the substrate processing apparatus according to the embodiments of the present disclosure.

FIG. 2 is a diagram schematically illustrating an exemplary configuration of the process vessel 202 of the substrate processing apparatus 10.

Process Vessel

For example, the process vessel 202 is constituted by a flat and sealed vessel whose horizontal cross-section is circular. The process vessel 202 is constituted by an upper vessel 2021 made of a non-metallic material such as quartz and ceramics and a lower vessel 2022 made of a metal material such as aluminum (Al) and stainless steel (SUS). A process space (also referred to as a "process chamber") 201 in which the wafer 200 is processed is provided in an upper region (that is, a space above a substrate mounting table 212 described later) of the process vessel 202, and a transfer space 203 is provided below the process space 201 in a space surrounded by the lower vessel 2022.

Lift pins 207 are provided at a bottom of the lower vessel 2022.

A substrate loading/unloading port 206 is provided on a side surface (side wall) of the lower vessel 2022 (which is a part of the process vessel 202) adjacent to a gate valve 205 (which corresponds to one of the gate valves 70a through 70d described above). The wafer 200 can be transferred into or out of the transfer space 203 through the substrate loading/unloading port 206. An O-ring 209a serving as a seal is provided around the gate valve 205. The gate valve 205 is constituted by a valve body 205a capable of opening and closing the substrate loading/unloading port 206 and a shaft 205b capable of supporting the valve body 205a. In other words, the gate valve 205 constituted by the valve body 205a and the shaft 205b is provided adjacent to the substrate loading/unloading port 206. By elevating or lowering the shaft 205b and the valve body 205a, it is possible to open or close the substrate loading/unloading port 206.

In addition, a viewport 300 is provided on a side surface (side wall) of the upper vessel 2021 (which is a part of the process vessel 202). The viewport 300 is configured such that the process space 201 (which is an inner space of the process vessel 202) can be visually recognized from an outside of the process vessel 202 through the viewport 300. An O-ring 209b serving as a seal is provided around the viewport 300. Alternatively, as long as the process space 201 can be visually recognized through the viewport 300, the viewport 300 may be provided on another wall such as an upper wall of the upper vessel 2021.

Substrate Support

A substrate support (also referred to as a "susceptor") 210 configured to support the wafer 200 is provided in the process space 201. The substrate support 210 is constituted mainly by: the substrate mounting table 212 provided with a substrate placing surface 211 on which the wafer 200 is placed; and a heater 213 serving as a heating structure embedded in the substrate mounting table 212. Throughholes 214 through which the lift pins 207 penetrate are provided at positions of the substrate mounting table 212 corresponding to the lift pins 207.

The substrate mounting table 212 is supported by a shaft 217. The shaft 217 penetrates the bottom of the lower vessel 2022, and is connected to an elevator 218 at the outside of the process vessel 202.

The wafer 200 placed on the substrate placing surface 211 of the substrate mounting table 212 can be elevated or lowered by operating the elevator 218 to elevate or lower the shaft 217 and the substrate mounting table 212. In addition, a bellows 219 covers a periphery of a lower end portion of the shaft 217 to maintain the process space 201 airtight.

When the wafer 200 is transferred, the substrate mounting table 212 is lowered until the substrate placing surface 211 faces the substrate loading/unloading port 206 (that is, until a wafer transfer position is reached). When the wafer 200 is processed, the wafer 200 is elevated until the wafer 200 reaches a processing position (also referred to as a "wafer processing position") in the process space 201.

Specifically, when the substrate mounting table 212 is lowered to the wafer transfer position, upper ends of the lift pins 207 protrude from an upper surface of the substrate placing surface 211, and the lift pins 207 support the wafer 200 from thereunder. In addition, when the substrate mounting table 212 is elevated to the wafer processing position, the lift pins 207 are buried from the upper surface of the substrate placing surface 211 and the substrate placing surface 211 supports the wafer 200 from thereunder.

Shower Head

A shower head 230 serving as a gas dispersion structure is provided at an upper portion of the process space 201 (that is, provided at an upstream side of the process space 201 in a gas supply direction). For example, the shower head 230 is inserted into a hole 2021a provided in the upper vessel 2021.

A lid 231 of the shower head 230 is made of, for example, an electrically conductive and thermally conductive metal. A block 233 is provided between the lid 231 and the upper vessel 2021. The block 233 electrically and thermally insulates the lid 231 from the upper vessel 2021. Further, an O-ring 209c serving as a seal is provided between the lid 231 and the block 233.

In addition, a through-hole 231a into which a gas supply pipe 241 serving as a first dispersion structure is inserted is provided in the lid 231 of the shower head 230. The gas supply pipe 241 inserted in the through-hole 231a is configured to disperse a gas supplied into a shower head buffer chamber 232 (which is a space provided in the shower head 230). For example, the gas supply pipe 241 is constituted by a front end structure 241a inserted into the shower head 230 and a flange 241b fixed to the lid 231. For example, the front end structure 241a is of a cylindrical shape, and a dispersion hole (or dispersion holes: not shown) is provided on a side surface of the front end structure 241a. Then, a gas supplied through a gas supplier (which is a gas supply system or a gas supply structure) described later is supplied into the shower head buffer chamber 232 through the dispersion hole provided in the front end structure 241a.

In addition, the shower head 230 is provided with a dispersion plate 234 serving as a second dispersion structure configured to disperse the gas supplied through the gas supplier (gas supply system) described later. An upstream side of the dispersion plate 234 is referred to as the shower head buffer chamber 232, and a downstream side of the dispersion plate 234 is referred to as the process space 201. The dispersion plate 234 is provided with a plurality of through-holes 234a. The dispersion plate 234 is arranged above the substrate placing surface 211 so as to face the substrate placing surface 211. Therefore, the shower head buffer chamber 232 communicates with the process space 201 via the plurality of through-holes 234a provided in the dispersion plate 234. Further, an O-ring 209d serving as a seal is provided between the lid 231 and the dispersion plate 234.

The through-hole 231a into which the gas supply pipe 241 is inserted is provided in the shower head buffer chamber 232.

Gas Supplier

A common gas supply pipe 242 is connected to the gas supply pipe 241 inserted into the through-hole 231a provided in the lid 231 of the shower head 230. The gas supply pipe 241 and the common gas supply pipe 242 communicate with each other through their inner structures. Further, a gas supplied through the common gas supply pipe 242 is supplied into the shower head 230 through the gas supply pipe 241 and the through-hole 231a.

A first gas supply pipe 243a, a second gas supply pipe 244a and a third gas supply pipe 245a are connected to the common gas supply pipe 242. The second gas supply pipe 244a may be connected to the common gas supply pipe 242 via a remote plasma structure (also referred to as a "remote plasma unit" or simply referred to as an "RPU") 244e. Although the second gas supply pipe 244a is connected to the common gas supply pipe 242 via the remote plasma structure 244e as shown in FIG. 2, in case the remote plasma structure 244e is not provided, the second gas supply pipe 244a can be directly connected to the common gas supply pipe 242.

A first element-containing gas is mainly supplied through a first gas supplier (which is a first gas supply system or a first gas supply structure) 243 including the first gas supply pipe 243a, and a second element-containing gas is mainly supplied through a second gas supplier (which is a second gas supply system or a second gas supply structure) 244 including the second gas supply pipe 244a. When processing the wafer 200, an inert gas is mainly supplied through a third gas supplier (which is a third gas supply system or a third gas supply structure) 245 including the third gas supply pipe 245a, and when cleaning a component such as an inner space of the shower head 230 and the process space 201, a cleaning gas is mainly supplied through the third gas supplier 245.

First Gas Supplier

A first gas supply source 243b, a mass flow controller (MFC) 243c serving as a flow rate controller (flow rate control structure) and a valve 243d serving as an opening/closing valve are sequentially provided in this order at the first gas supply pipe 243a from an upstream side toward a downstream side of the first gas supply pipe 243a. A gas containing a first element (hereinafter, also referred to as the "first element-containing gas") is supplied into the shower head 230 from the first gas supply source 243b through the first gas supply pipe 243a provided with the MFC 243c and the valve 243d and the common gas supply pipe 242.

The first element-containing gas serves as a source gas, which is one of process gases. According to the present embodiments, for example, the first element is silicon (Si). That is, for example, the first element-containing gas includes a silicon-containing gas. A source material of the first element-containing gas may be in a solid state, a liquid state or a gaseous state under the normal temperature and the normal pressure. When the source material of the first element-containing gas is in a liquid state under the normal temperature and the normal pressure, a vaporizer (not shown) may be provided between the first gas supply source 243b and the MFC 243c. Hereinafter, the present embodiments will be described in detail by way of an example in which the source material of the first element-containing gas is in a gaseous state under the normal temperature and the normal pressure.

A downstream end of a first inert gas supply pipe 246a is connected to the first gas supply pipe 243a downstream of the valve 243d provided at the first gas supply pipe 243a. An inert gas supply source 246b, a mass flow controller (MFC) 246c serving as a flow rate controller (flow rate control structure) and a valve 246d serving as an opening/closing valve are sequentially provided in this order at the first inert gas supply pipe 246a from an upstream side toward a downstream side of the first inert gas supply pipe 246a. The inert gas is supplied into the shower head 230 from the inert gas supply source 246b through the first inert gas supply pipe 246a provided with the MFC 246c and the valve 246d, the first gas supply pipe 243a and the common gas supply pipe 242.

According to the present embodiments, the inert gas acts as a carrier gas of the first element-containing gas. It is preferable that a gas that does not react with the first element is used as the inert gas. Specifically, for example, nitrogen ($N_2$) gas may be used as the inert gas. Alternatively, instead of the $N_2$ gas, a rare gas such as helium (He) gas, neon (Ne) gas and argon (Ar) gas may be used as the inert gas.

The first gas supplier (also referred to as a "silicon-containing gas supplier", a "silicon-containing gas supply system", or a "silicon-containing gas supply structure") 243 is constituted mainly by the first gas supply pipe 243a, the MFC 243c and the valve 243d. A first inert gas supplier (which is a first inert gas supply system or a first inert gas supply structure) is constituted mainly by the first inert gas supply pipe 246a, the MFC 246c and the valve 246d. The first gas supplier 243 may further include the first gas supply source 243b and the first inert gas supplier. In addition, the first inert gas supplier may further include the inert gas supply source 246b and the first gas supply pipe 243a. Since the first gas supplier 243 is configured to supply the source gas which is one of the process gases, the first gas supplier 243 is a part of a process gas supplier (also referred to as a "process gas supply system" or a "process gas supply structure").

Second Gas Supplier

The remote plasma structure 244e is provided downstream of the second gas supply pipe 244a. A second gas supply source 244b, a mass flow controller (MFC) 244c serving as a flow rate controller (flow rate control structure) and a valve 244d serving as an opening/closing valve are sequentially provided in this order at the second gas supply pipe 244a from an upstream side toward a downstream side of the second gas supply pipe 244a. A gas containing a second element (hereinafter, also referred to as the "second element-containing gas") is supplied into the shower head 230 from the second gas supply source 244b through the second gas supply pipe 244a provided with the MFC 244c and the valve 244d, the remote plasma structure 244e and the common gas supply pipe 242.

When the second element-containing gas is supplied onto the wafer 200 in a plasma state, the remote plasma structure 244e is operated to convert the second element-containing gas into the plasma state.

The second element-containing gas serves as a reactive gas or a modifying gas, which is one of process gases. According to the present embodiments, for example, the second element-containing gas contains the second element different from the first element described above. For example, the second element is one of oxygen (O), nitrogen (N) and carbon (C). According to the present embodiments, for example, a nitrogen-containing gas may be used as the second element-containing gas. Specifically, for example, ammonia ($NH_3$) gas may be used as the nitrogen-containing gas.

A downstream end of a second inert gas supply pipe 247a is connected to the second gas supply pipe 244a downstream of the valve 244d provided at the second gas supply pipe 244a. An inert gas supply source 247b, a mass flow controller (MFC) 247c serving as a flow rate controller (flow rate control structure) and a valve 247d serving as an opening/closing valve are sequentially provided in this order at the second inert gas supply pipe 247a from an upstream side toward a downstream side of the second inert gas supply pipe 247a. The inert gas is supplied into the shower head 230 from the inert gas supply source 247b through the second inert gas supply pipe 247a provided with the MFC 247c and the valve 247d, the second gas supply pipe 244a and the common gas supply pipe 242.

According to the present embodiments, the inert gas acts as a carrier gas of the second element-containing gas or a dilution gas of the second element-containing gas in a substrate processing described later. Specifically, for example, the $N_2$ gas may be used as the inert gas. Alternatively, instead of the $N_2$ gas, a rare gas such as helium (He) gas, neon (Ne) gas and argon (Ar) gas may be used as the inert gas.

The second gas supplier (also referred to as a "nitrogen-containing gas supplier", a "nitrogen-containing gas supply system", or a "nitrogen-containing gas supply structure") 244 is constituted mainly by the second gas supply pipe 244a, the MFC 244c and the valve 244d. A second inert gas supplier (which is a second inert gas supply system or a second inert gas supply structure) is constituted mainly by the second inert gas supply pipe 247a, the MFC 247c and the valve 247d. The second gas supplier 244 may further include the second gas supply source 244b, the remote plasma structure 244e and the second inert gas supplier. In addition, the second inert gas supplier may further include the inert gas supply source 247b, the second gas supply pipe 244a and the remote plasma structure 244e. Since the second gas supplier 244 is configured to supply the reactive gas or the modifying gas, which is one of the process gases, the second gas supplier 244 is a part of the process gas supplier (also referred to as the process gas supply system or the process gas supply structure).

Third Gas Supplier

A third gas supply source 245b, a mass flow controller (MFC) 245c serving as a flow rate controller (flow rate control structure) and a valve 245d serving as an opening/closing valve are sequentially provided in this order at the third gas supply pipe 245a from an upstream side toward a downstream side of the third gas supply pipe 245a. The cleaning gas is supplied into the shower head 230 from the third gas supply source 245b through the third gas supply pipe 245a provided with the MFC 245c and the valve 245d and the common gas supply pipe 242.

A downstream end of a third inert gas supply pipe 248a is connected to the third gas supply pipe 245a downstream of the valve 245d provided at the third gas supply pipe 245a. An inert gas supply source 248b, a mass flow controller (MFC) 248c serving as a flow rate controller (flow rate control structure) and a valve 248d serving as an opening/closing valve are sequentially provided in this order at the third inert gas supply pipe 248a from an upstream side toward a downstream side of the third inert gas supply pipe 248a. The inert gas is supplied into the shower head 230 from the inert gas supply source 248b through the third inert gas supply pipe 248a provided with the MFC 248c and the valve 248d, the third gas supply pipe 245a and the common gas supply pipe 242.

In a film-forming step described later, the inert gas is supplied into the shower head 230 from the inert gas supply source 248b through the third inert gas supply pipe 248a provided with the MFC 248c and the valve 248d, the third gas supply pipe 245a and the common gas supply pipe 242. The inert gas supplied into the shower head 230 in the film-forming step acts as a purge gas of purging a gas remaining in the process vessel 202 or in the shower head 230. Specifically, for example, the $N_2$ gas may be used as the inert gas. Alternatively, instead of the $N_2$ gas, a rare gas such as helium (He) gas, neon (Ne) gas and argon (Ar) gas may be used as the inert gas.

In a cleaning step described later, the cleaning gas is supplied into the shower head 230 from the third gas supply source 245b through the third gas supply pipe 245a provided with the MFC 245c and the valve 245d and the common gas supply pipe 242. The cleaning gas supplied into the shower head 230 in the cleaning step acts as a gas of cleaning deposits remaining in the process vessel 202 or in the shower head 230. Specifically, for example, nitrogen trifluoride ($NF_3$) gas or chlorine trifluoride ($ClF_3$) gas may be used as the cleaning gas.

The third gas supplier (also referred to as a "cleaning gas supplier", a "cleaning gas supply system", or a "cleaning gas supply structure") 245 is constituted mainly by the third gas supply pipe 245a, the MFC 245c and the valve 245d. The third gas supplier 245 may further include the third gas supply source 245b. A third inert gas supplier (which is a third inert gas supply system or a third inert gas supply structure) is constituted mainly by the third inert gas supply pipe 248a, the MFC 248c and the valve 248d. The third inert gas supplier may further include the inert gas supply source 248b and the third gas supply pipe 245a. The third gas supplier 245 may further include the third inert gas supplier.

Gas Exhauster

A gas exhauster (which is a gas exhaust system or a gas exhaust structure) through which an inner atmosphere of the process vessel 202 is exhausted includes an exhaust pipe 263 connected to the process vessel 202. Specifically, the gas exhauster includes the exhaust pipe 263 connected to the process space 201.

The exhaust pipe 263 is connected to the process space 201 at a side portion of the process space 201. An APC (Automatic Pressure Controller) 276 serving as a pressure controller configured to adjust (control) an inner pressure of the process space 201 to a predetermined pressure is provided at the exhaust pipe 263. The APC 276 includes a valve body (not shown) capable of adjusting an opening degree thereof. The APC 276 is configured to adjust a conductance of the exhaust pipe 263 in accordance with an instruction from a controller 500 described later. In addition, a valve 275 serving as an opening/closing valve is provided at the exhaust pipe 263 upstream of the APC 276, and a valve 277 serving as an opening/closing valve is provided at the exhaust pipe 263 downstream of the APC 276.

In addition, a vacuum pump 278 is provided at the exhaust pipe 263 downstream of the valve 277. The vacuum pump 278 is configured to exhaust the inner atmosphere of the process space 201 through the exhaust pipe 263.

(3) Configuration of Cooling Structure

Subsequently, a cooling structure provided in the process vessel 202 will be described in detail.

First, the reason for providing the cooling structure will be described. In the film-forming step of forming a film on the wafer 200, it is preferable to maintain the wafer 200 in a high temperature state. This is because, by maintaining the wafer 200 in the high temperature state, the energy of the gas supplied into the process space 201 and a reaction state on the wafer 200 may be higher than those in a low temperature (for example, room temperature) state. On the other hand, in the cleaning step, it is preferable that an inner temperature of the process vessel 202 is lower than that of the process vessel 202 in the film-forming step.

Specifically, as a measure against corrosion, for example, a coating such as a nickel fluoride coating may be formed on a component (such as the shaft 217 configured to support the shower head 230 and the substrate mounting table 212) made of a metal material such as stainless steel (SUS). In addition, as the measure against corrosion, for example, the coating such as the nickel fluoride coating may also be formed on a component such as the substrate loading/unloading port 206 and the gate valve 205. When the cleaning gas such as the $NF_3$ gas and the $ClF_3$ gas is supplied to the component coated with the nickel fluoride coating in a high temperature state, the cleaning gas may react with the nickel fluoride coating and thus the nickel fluoride coating may be peeled off. Thereby, particles may be generated due to a reaction between the cleaning gas and the nickel fluoride coating, and thus the film may be contaminated.

In addition, when the shower head 230 also serves as an electrode for generating a plasma, if the coating is peeled off and becomes non-uniform, there occurs a difference in a plasma generation state between a portion with the coating and a portion without the coating, which leads to a non-uniform plasma generation. As a result, it may not be possible to form the film uniformly on the wafer 200. In addition, an electric power may be concentrated on a portion with no coating where the coating is peeled off, and as a result, an abnormal discharge may occur. In addition, the process gases may corrode the metal material to thereby further generate the particles. Further, when the coating is non-uniform on a surface of the component parallel to the wafer 200, an amount of the plasma may become non-uniform on a surface of the wafer 200. Further, when the coating is non-uniform in the plurality of through-holes 234a of the shower head 230 along the vertical direction, the amount of plasma differs in each of the plurality of through-holes 234a.

For the above reasons, after the film-forming step is performed in the high temperature state and before the cleaning step is performed, it is preferable that a location (or component) where defects occur when the cleaning gas is supplied in the high temperature state is cooled and maintain in the low temperature state. Hereinafter, the location where the defects occur when the cleaning gas is supplied in the high temperature state may also be referred to as a "low temperature structure".

Therefore, as for such regions made of a material susceptible to corrosion by the process gases and being in contact with the process gases, a temperature lowering step is performed to cool the low temperature structure such as the shower head 230 and the shaft 217 where a corrosion prevention coating is performed.

Subsequently, a configuration of the cooling structure configured to cool the low temperature structure such as the shower head 230 and the shaft 217 will be described in detail with reference to FIG. 2.

A piping structure 316 is embedded around the lid 231 of the shower head 230 and in the vicinity of the O-rings 209c and 209d. Specifically, the piping structure 316 is provided between a heater 416 described later and the O-ring 209c and between the heater 416 and the O-ring 209d. In addition, a piping structure 317 is embedded around the substrate mounting table 212 and on an outer periphery of the heater 213. Further, a piping structure 318 extending in an axial direction is embedded inside the shaft 217 configured to support the substrate mounting table 212.

The piping structure 318 includes an outward path and a return path, each of which is connected to the piping structure 317. A coolant supply pipe similar to a supply pipe 310 described later is connected to the outward path such that a coolant can be supplied to the outward path. Further, a coolant discharge pipe similar to a discharge pipe 311 described later is connected to the return path. The coolant supplied through the coolant supply pipe is supplied to the outward path of the piping structure 318 and the piping structure 317, and is discharged through the coolant discharge pipe via the return path of the piping structure 318.

Further, a piping structure 322 is embedded on the side surface (side wall) of the lower vessel 2022 above a periphery of the substrate loading/unloading port 206 between the O-ring 209a and a heater 422 described later. In addition, a piping structure 319 is embedded below the periphery of the substrate loading/unloading port 206 between the O-ring 209a and a heater 419 described later. That is, the piping structures 319 and 322 are arranged in a circumferential direction on the side surface (side wall) of the lower vessel 2022, and the heaters 419 and 422 are arranged at inner peripheral regions of the piping structures 319 and 322, respectively. Further, a piping structure 321 extending in the axial direction is embedded inside the shaft 205b configured to support the valve body 205a of the gate valve 205. In addition, a piping structure 320 is embedded around the viewport 300 between the O-ring 209b and a heater 420 described later.

The coolant (cooling medium) is supplied to each of the piping structures 316, 317, 318, 319, 320, 321 and 322. That is, each of the piping structures 316, 317, 318, 319, 320, 321 and 322 is used as a coolant flow path. Each of the piping structures 316, 317, 318, 319, 320, 321 and 322 is made of a metal piping material with a high thermal conductivity such as aluminum (Al).

In the present specification, the coolant is a medium capable of maintaining a property of cooling even at a first temperature described later. For example, the coolant may be a gaseous coolant such as an inert gas or air. Therefore, it is possible to immediately cool the housing after processing the wafer 200 at the first temperature. As a comparative example, for example, a liquid coolant (for example, Galden) may be used. However, when the liquid coolant is used, the liquid coolant may boil at the first temperature (for example, 800° C.) described later and a cooling effect may deteriorate. On the other hand, when the gaseous coolant such as the inert gas or the air is used, the cooling effect can be maintained even at the first temperature. Therefore, it is possible to cool the housing in the high temperature state, and as a result, it is possible to reduce the downtime.

The heater 416 serving as a heating structure is provided around the lid 231 and located radially more inward than the piping structure 316. That is, the heater 416 is provided closer to a center of the process space 201 than the piping structure 316. Further, the heater 213 is located radially more inward than the piping structure 317. That is, the heater 213 is provided closer to the center of the process space 201 than the piping structure 317. In addition, the heater 419 serving as a heating structure is provided below the periphery of the substrate loading/unloading port 206 and located radially more inward than the piping structure 319 (at an inner side of the process vessel 202). That is, the heater 419 is provided closer to the center of the process space 201 than the piping structure 319. Further, the heater 422 serving as a heating structure is provided above the periphery of the substrate loading/unloading port 206 and located radially more inward than the piping structure 322 (at the inner side of the process vessel 202). That is, the heater 422 is provided closer to the center of the process space 201 than the piping structure 322. In addition, the heater 420 serving as a heating structure is provided around the viewport 300 and located radially more inward than the piping structure 320 (at the inner side of the process vessel 202). That is, the heater 420 is provided closer to the center of the process space 201 than the piping structure 320.

The piping structures 316, 317, 318, 319, 320, 321 and 322 are connected to one another via separate pipes. The supply pipe 310 through which the coolant is supplied is connected to an upstream end of the piping structure 319, and the discharge pipe 311 through which the coolant is discharged is connected to a downstream end of the piping structure 322. That is, the piping structures 316, 319, 320, 321 and 322 communicate with the supply pipe 310 and the discharge pipe 311. That is, the supply pipe 310 through which the coolant is supplied is connected to an upstream end of the coolant flow path configured by connecting the piping structures 316, 319, 320, 321 and 322, and the discharge pipe 311 through which the coolant is discharged to the outside of the process vessel 202 is connected to a downstream end of the coolant flow path. By combining the supply pipe and the discharge pipe as described above, it is possible to reduce the number of components for supplying and discharging the coolant, and it is also possible to reduce a cost of providing the components for supplying and discharging the coolant. Alternatively, the supply pipe 310 and the discharge pipe 311 may be connected to other piping structures, respectively. Further, the supply pipe 310 through which the coolant is supplied may be connected to an upstream end of a coolant flow path configured by connecting the piping structures 316 through 322, and the discharge pipe 311 through which the coolant is discharged to the outside of the process vessel 202 may be connected to a downstream end of the coolant flow path configured by connecting the piping structures 316 through 322.

A coolant gas supplier (which is a coolant gas supply system or a coolant gas supply structure) 310a and a valve 310b serving as an opening/closing valve are sequentially provided in this order at the supply pipe 310 from an upstream side toward a downstream side of the supply pipe 310. The coolant gas supplier 310a is configured such that the coolant is supplied to the coolant flow path through the coolant gas supplier 310a. That is, the supply pipe 310 is used as a supply pipe through which the coolant is supplied to the coolant flow path. Further, a valve 311b serving as an opening/closing valve is provided at the discharge pipe 311, and a vacuum pump 311c is connected to the discharge pipe 311 at a downstream end of the discharge pipe 311. That is, the vacuum pump 311c is connected to the coolant flow path. In addition, a pipe 312 serving as a branch path is connected to the discharge pipe 311 upstream of the valve 311b. A valve 312b is provided at the pipe 312. That is, the discharge pipe 311 is used as an exhaust pipe through which the coolant in the coolant flow path is discharged (or exhausted) to the outside of the process vessel 202.

By cooling the low temperature structure such as the shower head 230 and the shaft 217 to a predetermined temperature or lower as described above, it is possible to reduce a thermal effect on the low temperature structure where the defects occur when being supplied with the cleaning gas at the first temperature (which is a film-forming temperature).

By supplying the coolant to the coolant flow path provided at locations such as a wall surface of the process vessel 202, the shower head 230, the substrate mounting table 212 and the shafts 217 and 205b in the temperature lowering step and vacuum-exhausting the coolant flow path in a temperature elevating step and by using the heaters 416, 419, 420 and 422 located radially more inward than the coolant flow path, it is possible to shorten a temperature lowering time and a temperature elevating time, and as a result, it is also possible to improve an operating rate of the substrate processing apparatus 10.

Further, by arranging the coolant flow path in the vicinity of the O-rings 209a through 209d in a manner similar to that described above, it is possible to prevent (or suppress) the O-rings 209a through 209d from deteriorating. Therefore, the O-rings 209a through 209d may also be referred to as the low temperature structure. In addition, the wall surface of the process vessel 202 in the vicinity of the substrate loading/unloading port 206 or in the vicinity of the viewport 300 may also be referred to as the low temperature structure.

Further, temperature sensors 516, 517, 518, 519, 520 and 521 (which are configured to detect temperatures in the vicinity of the piping structures 316, 317, 318, 319, 320, 321 and 322, respectively) are provided in the vicinity of the piping structures 316, 317, 318, 319, 320, 321 and 322, respectively.

(4) Configuration of Controller

Subsequently, a configuration of the controller 500 serving as a control apparatus (control structure) will be described.

The controller 500 controls the above-described components of the substrate processing apparatus 10 to perform the substrate processing described later.

Figure 3:
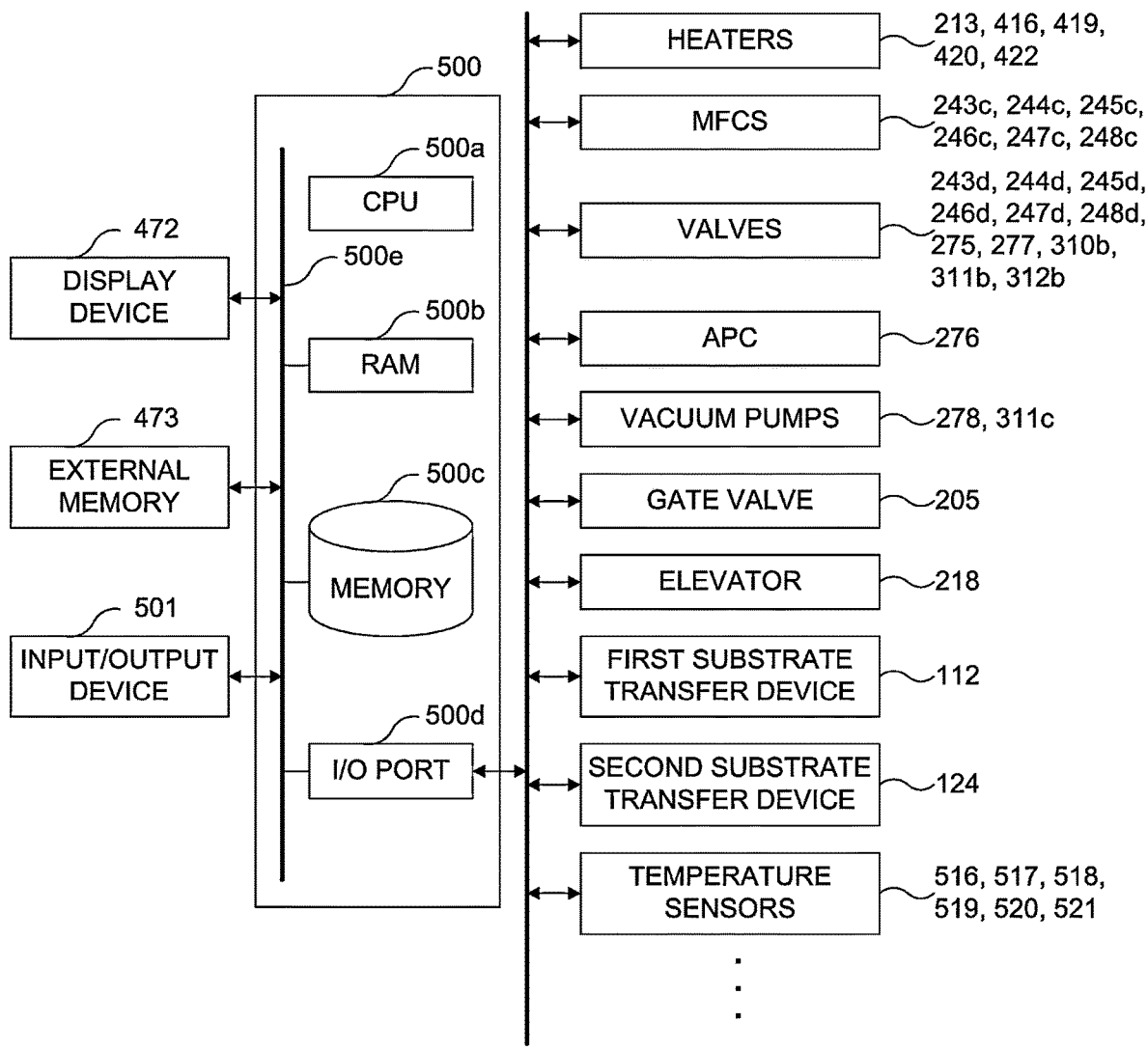
FIG. 3 is a block diagram schematically illustrating a configuration of a controller and related components of the substrate processing apparatus according to the embodiments of the present disclosure.

As shown in FIG. 3, the controller 500 is constituted by a computer including a CPU (Central Processing Unit) 500a, a RAM (Random Access Memory) 500b, a memory 500c and an I/O port 500d. The RAM 500b, the memory 500c and the I/O port 500d may exchange data with the CPU 500a through an internal bus 500e. For example, an input/output device 501 such as a touch panel and a display device 472 such as a display are connected to the controller 500.

The memory 500c is configured by a component such as a flash memory and a hard disk drive (HDD). For example, a control program configured to control the operation of the substrate processing apparatus 10 or a process recipe containing information on the sequences and conditions of the substrate processing described later may be readably stored in the memory 500c. The process recipe is obtained by combining steps of the substrate processing described later such that the controller 500 can execute the steps to acquire a predetermined result, and functions as a program. Hereafter, the process recipe and the control program may be collectively or individually referred to as a "program". In the present specification, the term "program" may refer to the process recipe alone, may refer to the control program alone, or may refer to both of the process recipe and the control program. The RAM 500b functions as a memory area (work area) where a program or data read by the CPU 500a is temporarily stored.

The I/O port 500d is connected to the above-described components such as the heaters 213, 416, 419, 420 and 422, the MFCs 243c, 244c, 245c, 246c, 247c and 248c, the valves 243d, 244d, 245d, 246d, 247d, 248d, 275, 277, 310b, 311b and 312b, the APC 276, the vacuum pumps 278 and 311c, the gate valve 205, the elevator 218, the first substrate transfer device 112, the second substrate transfer device 124 and the temperature sensors 516, 517, 518, 519, 520 and 521.

The CPU 500a is configured to read the control program from the memory 500c and execute the read control program. In addition, the CPU 500a is configured to read the recipe from the memory 500c in accordance with an operation command inputted from the input/output device 501. According to the contents of the read recipe, the CPU 500a may be configured to be capable of controlling various operations such as heating and cooling operations for the wafer 200 by the heater 213, a pressure adjusting operation by the APC 276, flow rate adjusting operations for the process gases by the MFCs 243c, 244c, 245c, 246c, 247c and 248c and the valves 243d, 244d, 245d, 246d, 247d and 248d, an elevating and rotating operation for the substrate support 210 by the elevator 218, a supplying and discharging operation and a vacuum-exhausting operation for the coolant to the coolant flow path by the temperature sensors 516, 517, 518, 519, 520 and 521, the valves 310b, 311b and 312b and the vacuum pump 311c, and a temperature elevating and lowering operation for the process vessel 202 by the heaters 416, 419, 420 and 422.

The controller 500 is not limited to a dedicated computer, and may be embodied by a general-purpose computer. For example, the controller 500 may be embodied by preparing an external memory 473 (for example, a magnetic tape, a magnetic disk such as a flexible disk and a hard disk, an optical disk such as a CD and a DVD, a magneto-optical disk such as an MO, a semiconductor memory such as a USB memory and a memory card) where the above-described program is stored and installing the program onto the general-purpose computer using the external memory 473. A method of providing the program to the computer is not limited to using the external memory 473. For example, the program may be supplied to the computer (general-purpose computer) using communication means such as the Internet and a dedicated line instead of the external memory 473. Further, the memory 500c or the external memory 473 may be embodied by a non-transitory computer readable recording medium. Hereafter, the memory 500c and the external memory 473 may be collectively or individually referred to as a "recording medium". In the present specification, the term "recording medium" may refer to the memory 500c alone, may refer to the external memory 473 alone or may refer to both of the memory 500c and the external memory 473.

(5) Substrate Processing

Hereinafter, as a part of a manufacturing process of a semiconductor device, a process (that is, the substrate processing) of forming a film on the wafer 200 using the process vessel 202 will be described. In the following description, the operations of the components constituting the substrate processing apparatus 10 are controlled by the controller 500.

In the following description, an example of forming a silicon nitride film (also simply referred to as an "SiN film") serving as the film on the wafer 200 by alternately supplying the first element-containing gas (first process gas) and the second element-containing gas (second process gas) to the wafer 200 will be described. For example, a silicon-containing gas obtained by vaporizing hexachlorodisilane ($Si_2Cl_6$, abbreviated as HCDS) gas is used as the first element-containing gas, and the $NH_3$ gas is used as the second element-containing gas.

Figure 4:
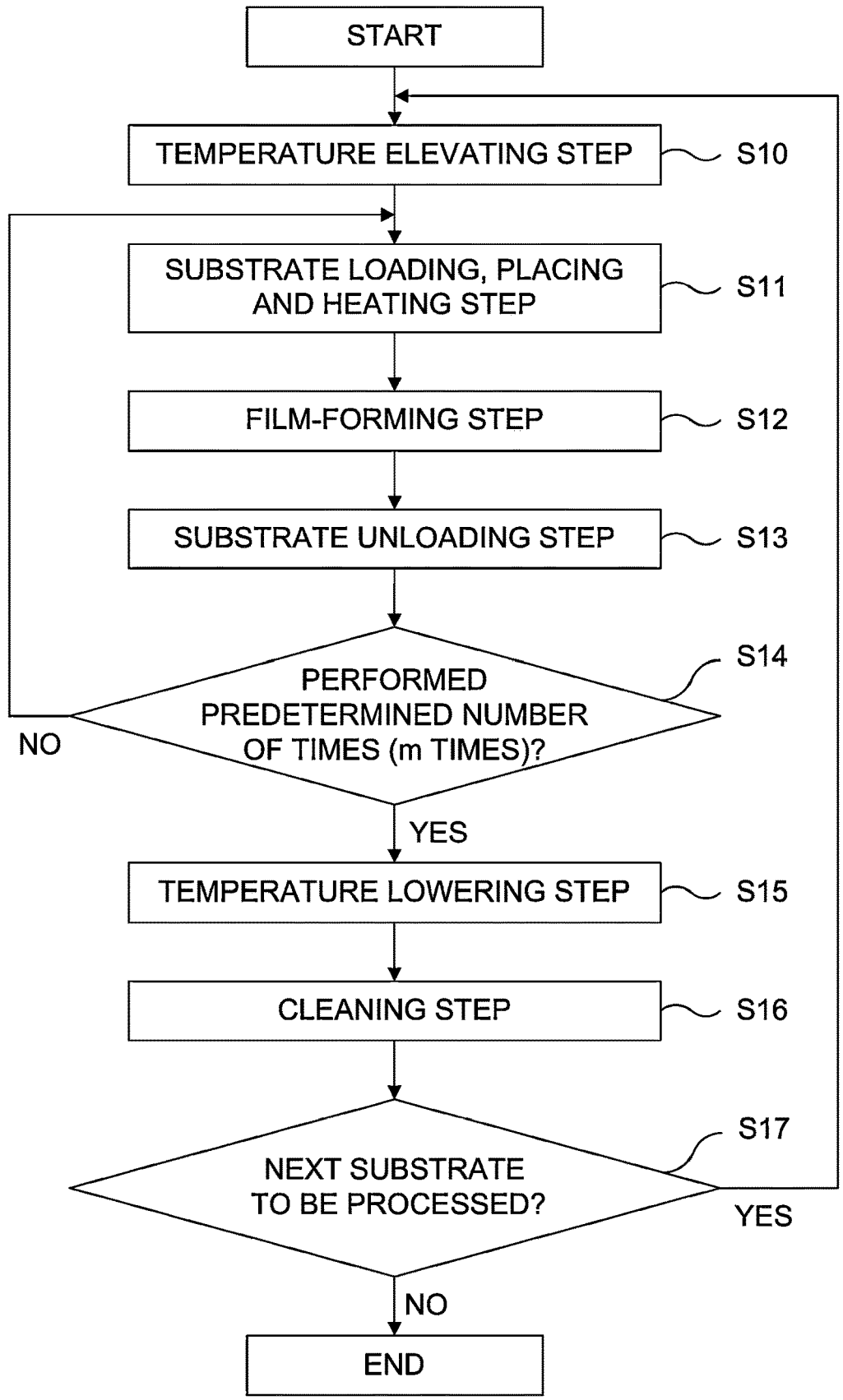
FIG. 4 is a flowchart schematically illustrating a substrate processing according to the embodiments of the present disclosure.

FIG. 4 is a flowchart schematically illustrating the substrate processing according to the embodiments of the present disclosure.

Temperature Elevating Step: S10

In the temperature elevating step S10, the inner temperature of the process vessel 202 is elevated while the wafer 200 is not supported by the substrate support 210.

In the temperature elevating step S10, it is preferable to safely prevent the outside of the process vessel 202 from entering the high temperature state. Therefore, in the temperature elevating step S10, the controller 500 turns on the power of each of the heaters 416, 419, 420, 422 and 213 while maintaining insides of the piping structures 316, 319, 320, 321 and 322 in a vacuum state. Further, with the valves 310b and 312b closed and the valve 311b open, the vacuum pump 311c is operated to vacuum-exhaust (evacuate) the insides of the piping structures 316, 319, 320, 321 and 322. That is, the coolant flow path is vacuum-exhausted to perform the temperature elevating step S10. Therefore, the coolant flow path is used as a vacuum heat insulator such that it is possible to prevent the heat inside the process vessel 202 from being released to the outside of the process vessel 202. It is also possible to shorten an amount of time taken to elevate a temperature up to the first temperature (which is the film-forming temperature). In addition, since the coolant flow path is provided between the heater and each O-ring, it is possible to reduce the heat conduction from each heater to the coolant flow path, and as a result, it is possible to prevent (or suppress) the O-ring from deteriorating.

For example, a distance between the substrate placing surface 211 and the shower head 230 in the temperature elevating step S10 is set to be greater than the distance between the substrate placing surface 211 and the shower head 230 in the film-forming step S12 described later. Thereby, it is possible to reduce an influence of the heater 213 provided at the substrate support 210, and as a result, it is also possible to suppress a temperature elevation of the shower head 230 due to the heat generated by the heater 213.

Substrate Loading, Placing and Heating Step: S11

In the substrate loading, placing and heating step S11, first, the substrate mounting table 212 in the process vessel 202 is lowered to the wafer transfer position such that the lift pins 207 penetrate the through-holes 214 of the substrate mounting table 212. As a result, the lift pins 207 protrude from a surface of the substrate mounting table 212 by a predetermined height. Subsequently, the gate valve 205 is opened such that the transfer space 203 communicates with the first transfer chamber 103. Then, the wafer 200 is transferred (loaded) into the transfer space 203 using the first substrate transfer device 112 provided in the first transfer chamber 103 such that the wafer 200 is placed onto the lift pins 207. As a result, the wafer 200 is supported in a horizontal orientation on the lift pins 207 protruding from the surface of the substrate mounting table 212.

After the wafer 200 is loaded into the process vessel 202 (that is, into the first transfer chamber 103), the first substrate transfer device 112 is retracted to the outside of the process vessel 202, and the gate valve 205 is closed to seal (close) the inside of the process vessel 202 hermetically. Thereafter, by elevating the substrate mounting table 212, the wafer 200 is placed on the substrate placing surface 211 of the substrate mounting table 212. By further elevating the substrate mounting table 212, the wafer 200 is elevated to the processing position (wafer processing position) in the process space 201 described above.

After the wafer 200 is loaded into the transfer space 203 and elevated to wafer the processing position in the process space 201, the valve 277 and the valve 275 are opened to communicate the process space 201 with the APC 276 and the APC 276 with the vacuum pump 278.

By adjusting the conductance of the exhaust pipe 263, the APC 276 controls (adjusts) an exhaust flow rate of the process space 201 by the vacuum pump 278, and maintains the inner pressure of the process space 201 at a predetermined pressure (for example, a high vacuum of 10-5 Pa to 10-1 Pa).

In the substrate loading, placing and heating step S11, the inner pressure of the process space 201 is adjusted to the predetermined pressure, and the heater 213 is controlled such that a surface temperature of the wafer 200 is adjusted to a temperature at which the wafer 200 is processed (that is, the first temperature). For example, the first temperature is set to a temperature within a range from 700° C. to 1,000° C., specifically 800° C. to 900° C. According to the present embodiments, the first temperature refers to a temperature at which the film such as the SiN film can be formed in the film-forming step S12 described later. In addition, in the present specification, for example, a numerical range such as "700° C. to 1,000° C." refers to a range that a lower limit and an upper limit are included in the numerical range. Therefore, for example, the numerical range "700° C. to 1,000° C." means a range equal to or more than 700° C. and equal to or less than 1,000° C. The same also applies to other numerical ranges described herein.

Film-Forming Step: S12

Subsequently, the film-forming step S12 is performed. Hereinafter, the film-forming step S12 will be described in detail with reference to FIG. 5. As the film-forming step S12, a cyclic process may be performed by repeating alternately supplying different process gases (that is, by repeatedly and alternately performing a first process gas supply step S20 and a second process gas supply step S22 described later).

Further, in the film-forming step S12, the wafer 200 is heated to the first temperature while the wafer 200 is supported by the substrate support 210, and the process gases are supplied into the process vessel 202 accommodating the substrate support 210. Therefore, the film-forming step S12 may also be referred to as a "process gas supply step". In addition, the process gases may also be collectively or individually referred to as the "process gas".

Further, the film-forming step S12 is performed in a state in which the corrosion prevention coating is performed on a region of the shower head 230 (which is made of a material susceptible to corrosion by the process gases) in contact with the process gases. In addition, similar to the shower head 230, the film-forming step S12 is performed in a state in which the low temperature structure such as the shaft 217 is coated by the corrosion prevention coating.

According to the present embodiments, in the film-forming step S12, the controller 500 operates the vacuum pump 311c with the valves 310b and 312b closed and the valve 311b open so as to vacuum-exhaust (evacuate) the insides of the piping structures 316, 319, 320, 321 and 322. That is, the coolant flow path is vacuum-exhausted to perform the film-forming step S12. Therefore, the coolant flow path is used as the vacuum heat insulator such that it is possible to prevent the heat inside the process vessel 202 from being released to the outside of the process vessel 202. In addition, in the film-forming step S12, as long as the temperature of the wafer 200 can be maintained at the first temperature, the power of each of the heaters 416, 419, 420 and 422 may be turned off.

First Process Gas Supply Step: S20

In the film-forming step S12, the first process gas supply step S20 is performed first. When the silicon-containing gas serving as the first process gas (first element-containing gas) is supplied in the first process gas supply step S20, with the valve 243d open, the MFC 243c is controlled such that a flow rate of the silicon-containing gas is adjusted to a predetermined flow rate. As a result, a supply of the silicon-containing gas into the process space 201 is started. In addition, for example, a supply flow rate of the silicon-containing gas may be equal to or more than 100 sccm and equal to or less than 5,000 sccm. When supplying the silicon-containing gas, with the valve 248d of the third gas supplier 245 open, the $N_2$ gas is supplied through the third gas supply pipe 245a. In addition, the $N_2$ gas may be flown through the first inert gas supplier. Further, prior to the film-forming step S12, a supply of $N_2$ gas through the third gas supply pipe 245a may be started.

The silicon-containing gas supplied into the process space 201 is then supplied onto the wafer 200. By the silicon-containing gas contacting the surface of the wafer 200, a silicon-containing layer serving as a first element-containing layer is formed on the surface of the wafer 200.

For example, the silicon-containing layer of a predetermined thickness and a predetermined distribution is formed according to the conditions such as an inner pressure of the process vessel 202 (that is, the inner pressure of the process space 201), the flow rate of the silicon-containing gas, a temperature of the substrate support (susceptor) 210 and a time taken for the silicon-containing gas to pass through the process space 201. A predetermined film may be formed on the wafer 200 in advance. Further, a predetermined pattern may be formed in advance on the wafer 200 or the predetermined film.

After a predetermined time has elapsed from the start of the supply of the silicon-containing gas, the valve 243d is closed to stop the supply of the silicon-containing gas. For example, a supply time (time duration) of supplying the silicon-containing gas may be equal to or more than 2 seconds and equal to or less than 20 seconds.

In the first process gas supply step S20, with the valve 275 and the valve 277 open, the inner pressure of the process space 201 is controlled (adjusted) by the APC 276 to a predetermined pressure.

Purge Step: S21

After the supply of the silicon-containing gas is stopped, the $N_2$ gas is supplied through the third gas supply pipe 245a to purge the process space 201. In the purge step S21, with the valve 275 and the valve 277 open, the inner pressure of the process space 201 is controlled (adjusted) by the APC 276 to a predetermined pressure. As a result, the silicon-containing gas that could not be bonded to the wafer 200 in the first process gas supply step S20 is removed from the process space 201 by the vacuum pump 278 through the exhaust pipe 263.

In the purge step S21, a large amount of the purge gas may be supplied to improve an exhaust efficiency in order to remove the silicon-containing gas remaining in the wafer 200, the process space 201 and the shower head buffer chamber 232.

After the process space 201 is sufficiently purged, the pressure control by the APC 276 is resumed with the valve 275 and the valve 277 open. Further, the $N_2$ gas may be continuously supplied through the third gas supply pipe 245a to purge the shower head 230 and the process space 201.

Second Process Gas Supply Step: S22

After the shower head buffer chamber 232 and the process space 201 are purged, the second process gas supply step S22 is subsequently performed. In the second process gas supply step S22, with the valve 244d open, a supply of the $NH_3$ gas serving as the second process gas (second element-containing gas) into the process space 201 through the shower head 230 is started. In the second process gas supply step S22, the MFC 244c is controlled such that a flow rate of the $NH_3$ gas is adjusted to a predetermined flow rate. For example, a supply flow rate of the $NH_3$ gas may be equal to or more than 1,000 sccm and equal to or less than 10,000 sccm. In addition, in the second process gas supply step S22, with the valve 248d of the third gas supplier 245 open, the $N_2$ gas is supplied through the third gas supply pipe 245a. By supplying the $N_2$ gas through the third gas supply pipe 245a, it is possible to prevent the $NH_3$ gas from entering the third gas supplier 245.

The $NH_3$ gas is supplied into the process space 201 through the shower head 230. The $NH_3$ gas supplied into the process space 201 reacts with the silicon-containing layer on the wafer 200. Thereby, the silicon-containing layer formed on the wafer 200 is modified by the $NH_3$ gas. As a result, for example, a silicon nitride layer (also simply referred to as an "SiN layer") containing silicon (Si) and nitrogen (N) is formed on the wafer 200.

After a predetermined time has elapsed from the start of the supply of the $NH_3$ gas, the valve 244d is closed to stop the supply of the $NH_3$ gas. For example, a supply time (time duration) of supplying the $NH_3$ gas may be equal to or more than 2 seconds and equal to or less than 20 seconds.

In the second process gas supply step S22, similar to the first process gas supply step S20, the inner pressure of the process space 201 is controlled (adjusted) by the APC 276 to become a predetermined pressure with the valve 275 and the valve 277 open.

Purge Step S23

After the supply of the $NH_3$ gas is stopped, the purge step S23 similar to the purge step S21 described above is performed. The operations of the components of the substrate processing apparatus 10 in the purge step S23 is similar to those of the components in the purge step S21. Therefore, the detailed descriptions of the purge step S23 are omitted.

Determination Step: S24

In the determination step S24, the controller 500 determines whether a cycle including the first process gas supply step S20, the purge step S21, the second process gas supply step S22 and the purge step S23 has been performed a predetermined number of times (n times). By performing the cycle the predetermined number of times, the SiN layer of a desired thickness is formed on the wafer 200.

After the film-forming step S12 constituted by the first process gas supply step S20, the purge step S21, the second process gas supply step S22 and the purge step S23 is performed the predetermined number of times (n times), a substrate unloading step S13 is performed.

Substrate Unloading Step: S13

In the substrate unloading step S13, the processed wafer 200 is transferred (unloaded) out of the process vessel 202 in the order reverse to that of the substrate loading, placing and heating step S11.

Determination Step: S14

In the determination step S14, the controller 500 determines whether a cycle including the substrate loading, placing and heating step S11, the film-forming step S12 and the substrate unloading step S13 has been performed a predetermined number of times (m times). When it is determined, in the determination step S14, that the cycle has not been performed the predetermined number of times (m times) ("NO" in FIG. 4), the substrate loading, placing and heating step S11, the film-forming step S12 and the substrate unloading step S13 are performed again to process a next wafer (unprocessed wafer) 200. When it is determined, in the determination step S14, that the cycle has been performed the predetermined number of times (m times) ("YES" in FIG. 4), a temperature lowering step S15 is subsequently performed. By performing the cycle the predetermined number of times (m times), the SiN film of a desired thickness is formed on the wafer 200 and the locations such as the wall surface of the process vessel 202.

Temperature Lowering Step: S15

In the temperature lowering step S15, while the wafer 200 is not supported by the substrate support 210, the coolant is supplied into the piping structures 316, 317, 318, 319, 320, 321 and 322 for a predetermined time. That is, by supplying the coolant to the coolant flow path for the predetermined time, a temperature of the low temperature structure such as the shower head 230 and the shaft 217 and the inner temperature of the process vessel 202 are lowered to a predetermined temperature.

That is, in the temperature lowering step S15, the coolant is supplied to the coolant flow path provided in the process vessel 202 for the predetermined time after the film forming step S12. As a result, the temperature of the low temperature structure such as the shower head 230 and the shaft 217 is lowered to a second temperature lower than the first temperature and at which the coating does not deteriorate.

In the temperature lowering step S15, with the power of each of the heaters 213, 416, 419, 420 and 422 turned off, the valves 310b and 312b open and the valve 311b closed, the controller 500 controls the coolant gas supplier 310a to supply the coolant to the coolant flow path. The coolant supplied through the coolant gas supplier 310a is discharged to an outside of the substrate processing apparatus 10 through the supply pipe 310, the valve 310b, the piping structures 319, 316, 320, 321, and 322, the discharge pipe 311, the pipe 312 and the valve 312b. That is, in the temperature lowering step S15, the coolant is supplied to the coolant flow path through the coolant gas supplier 310a to cool the vicinities of the piping structures 319, 316, 317, 318, 320, 321 and 322. In the temperature lowering step S15, when the inner temperature of the process vessel 202 is lowered to the second temperature based on the temperature information detected by the temperature sensors 516 through 521, the valves 310b and 312b are closed to stop the supplying and discharging operation of the coolant to the coolant flow path. As a result, it is possible to shorten an amount of time taken to lower a temperature down to the second temperature (which is a cleaning temperature).

For example, the distance between the substrate placing surface 211 and the shower head 230 in the temperature lowering step S15 may be set to be greater than the distance between the substrate placing surface 211 and the shower head 230 in the film-forming step S12 described above. Thereby, it is possible to reduce the influence of the heater 213 provided at the substrate support 210, and as a result, it is also possible to suppress the temperature elevation of the shower head 230 due to the heat generated by the heater 213 or accumulated in the substrate mounting table 212.

Cleaning Step: S16

In the cleaning step S16, the cleaning gas is supplied into the process vessel 202. That is, while the wafer 200 is not supported by the substrate support 210, the cleaning gas is supplied into the process vessel 202 to clean the process vessel 202. In the cleaning step S16, for example, the inner temperature of the process space 201 (that is the inner temperature of the process vessel 202) is set to a temperature within a range from 100° C. to 500° C., specifically 300° C. to 500° C.

Specifically, the cleaning gas is supplied through the third gas supply pipe 245a to clean an inside of the shower head 230 or the inside of the process vessel 202. That is, in the cleaning step S16, with the valve 245d open, the MFC 245c is controlled such that a flow rate of the cleaning gas becomes a predetermined flow rate. As a result, a supply of the cleaning gas into the process space 201 is started. When supplying the cleaning gas, with the valve 275 and the valve 277 open, the inner pressure of the process space 201 is controlled (adjusted) by the APC 276 to a predetermined pressure. As a result, the deposits remaining in locations such as the inside of the shower head 230, the substrate support 210 and an inner wall of the process vessel 202 are removed from the process space 201 by the vacuum pump 278 through the exhaust pipe 263.

That is, after the temperature lowering step S15, while the wafer 200 is not supported by the substrate support 210, the cleaning gas is supplied into the process vessel 202 in the cleaning step S16 to clean the locations such as the inside of the shower head 230, the shaft 217 and the inner wall of the process vessel 202.

According to the present embodiments, in the cleaning step S16, the controller 500 operates the vacuum pump 311c with the power of each of the heaters 416, 419, 420 and 422 turned off, the valves 310b and 312b closed and the valve 311b open so as to vacuum-exhaust (evacuate) the insides of the piping structures 316, 319, 320, 321 and 322. That is, the coolant flow path is vacuum-exhausted to perform the cleaning step S16. Therefore, the coolant flow path is used as the vacuum heat insulator.

Determination Step: S17

After the cleaning step S16, the determination step S17 is performed. In the determination step S17, when a next wafer 200 to be processed exists ("YES" in FIG. 4), the temperature elevating step S10 through the cleaning step S16 are performed again, and when the next wafer 200 to be processed does not exist ("NO" in FIG. 4), the substrate processing is terminated.

OTHER EMBODIMENTS

While the technique of the present disclosure is described in detail by way of the above-described embodiments, the technique of the present disclosure is not limited thereto. The technique of the present disclosure may be modified in various ways without departing from the scope thereof.

For example, the above-described embodiments are described by way of an example in which the SiN film is formed on the wafer 200 by alternately supplying, in the film-forming step S12 performed by the substrate processing apparatus 10, the silicon-containing gas serving as the first element-containing gas (first process gas) and the $NH_3$ gas serving as the second element-containing gas (second process gas). However, the technique of the present disclosure is not limited thereto. For example, the process gases used in the film-forming step are not limited to the silicon-containing gas and the $NH_3$ gas. That is, the technique of the present disclosure may also be applied to other film-forming steps wherein other gases are used to form different films, or three or more different process gases are non-simultaneously supplied to form a film. Specifically, instead of silicon, for example, an element such as titanium (Ti), zirconium (Zr) and hafnium (Hf) may be used as the first element. In addition, instead of nitrogen (N), for example, an element such as oxygen (O) may be used as the second element.

In addition, the above-described embodiments are described by way of an example in which the supply pipe 310 through which the coolant is supplied is connected to the upstream end of the coolant flow path configured by connecting the piping structures 316, 319, 320, 321 and 322, and the discharge pipe 311 through which the coolant is discharged to the outside of the process vessel 202 is connected to the downstream end of the coolant flow path configured by connecting the piping structures 316, 319, 320, 321 and 322. However, the technique of the present disclosure is not limited thereto. For example, the supply pipe 310 through which the coolant is supplied is connected to each upstream end of the piping structures 316 through 322, and the discharge pipe 311 through which the coolant is discharged to the outside of the process vessel 202 is connected to each downstream end of the piping structures 316 through 322. Thereby, it possible to shorten a cooling time, and it is also possible to control the cooling and the heating in the vicinity of each coolant flow path configured by each piping structures 316 through 322.

In addition, the above-described embodiments are described by way of the example in which the supply pipe 310 through which the coolant is supplied is connected to the upstream end of the coolant flow path configured by connecting the piping structures 316, 319, 320, 321 and 322, and the discharge pipe 311 through which the coolant is discharged to the outside of the process vessel 202 is connected to the downstream end of the coolant flow path configured by connecting the piping structures 316, 319, 320, 321 and 322. However, the technique of the present disclosure is not limited thereto. For example, a cooling apparatus (cooler) may be provided in the coolant flow path such that the coolant can be circulated while being cooled and without being discharged to the outside of the process vessel 202.

In addition, the above-described embodiments are described by way of an example in which the film-forming step S12 is performed while the power of each of the heaters 416, 419, 420 and 422 is turned off. However, the technique of the present disclosure is not limited thereto. For example, the film-forming step S12 may be performed while the power of each of the heaters 416, 419, 420 and 422 is turned on. As a result, it is possible to heat the inside of the process vessel 202 from around the substrate support 210.

In addition, the above-described embodiments are described by way of an example in which the coolant flow path is vacuum-exhausted (evacuated) in the film-forming step S12 such that the coolant flow path is used as the vacuum heat insulator. However, the technique of the present disclosure is not limited thereto. For example, in the film-forming step S12, the coolant may be supplied to the coolant flow path provided in the shaft 205*b* of the gate valve 205 to cool the shaft 205*b*.

According to some embodiments of the present disclosure, it is possible to shorten the downtime of the substrate processing apparatus and to improve the operating rate of the substrate processing apparatus.

What is claimed is:

1. A method of manufacturing a semiconductor device, comprising:
   (a) heating a substrate to a first temperature while supporting the substrate on a substrate support, and supplying a process gas into a process vessel accommodating the substrate support;
   (b) lowering a temperature of a low temperature structure provided in the process vessel to a second temperature lower than the first temperature by supplying an inert gas or air to a coolant flow path provided in the process vessel and connected to a vacuum pump after (a) for a predetermined time, wherein corrosion or peel-off of a coating occurs when a cleaning gas is supplied to the low temperature structure at the first temperature; and
   (c) cleaning the low temperature structure by supplying the cleaning gas into the process vessel after (b),
   wherein the coolant flow path is vacuum-exhausted while the vacuum pump is in operation during at least one of (a) or (c).

2. The method of claim 1, wherein the inert gas supplied to the coolant flow path comprises a gas capable of maintaining a cooling effect at the first temperature.

3. The method of claim 1, wherein a valve is provided at the coolant flow path, and is closed when the second temperature is reached in (b).

4. The method of claim 1, further comprising
   (d) elevating an inner temperature of the process vessel after (c) without supporting the substrate on the substrate support.

5. The method of claim 4, wherein the vacuum pump vacuum-exhausts the coolant flow path in (d).

6. The method of claim 4, wherein a heater located radially more inward than the coolant flow path is controlled in (d).

7. The method of claim 4, wherein a heater is embedded in the substrate support, and a distance between the substrate support and the low temperature structure is set to be greater in (d) than in (a).

8. The method of claim 1, wherein the low temperature structure is made of a material susceptible to corrosion by the process gas and a corrosion prevention coating is formed on a region of the low temperature structure in contact with the process gas, and
   wherein the process gas is supplied in (a) in a state in which the low temperature structure is coated by the corrosion prevention coating, and
   the temperature of the low temperature structure is lowered in (b) to a temperature capable of preventing a deterioration of the corrosion prevention coating.

9. The method of claim 1, wherein the low temperature structure comprises a shower head, and the coolant flow path is provided around the shower head.

10. The method of claim 1, wherein the low temperature structure comprises a shower head made of a material susceptible to corrosion by the process gas and a corrosion prevention coating is formed on a surface of the shower head parallel to the substrate, and
    wherein the process gas is supplied in (a) in a state in which the low temperature structure is coated by the corrosion prevention coating, and
    the temperature of the low temperature structure is lowered in (b) to a temperature capable of preventing a deterioration of the corrosion prevention coating.

11. The method of claim 1, wherein the low temperature structure comprises a shower head made of a material susceptible to corrosion by the process gas and a corrosion prevention coating is formed on a through-hole of the shower head, and
    wherein the process gas is supplied in (a) in a state in which the low temperature structure is coated by the corrosion prevention coating, and
    the temperature of the low temperature structure is lowered in (b) to a temperature capable of preventing a deterioration of the corrosion prevention coating.

12. The method of claim 1, wherein the low temperature structure comprises a shaft supporting the substrate support, and the coolant flow path is provided inside the shaft.

13. The method of claim 1, wherein a substrate loading/unloading port is provided at the process vessel,
    a gate valve constituted by a valve body and a shaft is provided adjacent to the substrate loading/unloading port, and
    the low temperature structure is located in vicinity of the substrate loading/unloading port.

14. The method of claim 1, wherein a viewport is provided at the process vessel such that an inside of the process vessel is visually recognizable from an outside of the process vessel through the viewport, and
    the low temperature structure is located in vicinity of the viewport.

15. The method of claim 1, wherein the low temperature structure comprises an O-ring, and the coolant flow path is provided around the O-ring.

16. The method of claim 15, wherein the coolant flow path is provided between the O-ring and a heater.

17. The method of claim 1, wherein a heater is embedded in the substrate support, and a distance between the substrate support and the low temperature structure is set to be greater in (b) than in (a).

18. A substrate processing apparatus configured to be capable of performing the method of claim 1.

19. A method of manufacturing a semiconductor device, comprising:
- (a) heating a substrate to a first temperature while supporting the substrate on a substrate support, and supplying a process gas into a process vessel accommodating the substrate support;
- (b) lowering a temperature of a low temperature structure provided in the process vessel to a second temperature lower than the first temperature by supplying an inert gas or air to a coolant flow path provided in the process vessel and connected to a vacuum pump after (a) for a predetermined time, wherein corrosion or peel-off of a coating occurs when a cleaning gas is supplied to the low temperature structure at the first temperature; and
- (c) cleaning the low temperature structure by supplying the cleaning gas into the process vessel after (b),
- wherein the coolant flow path is vacuum-exhausted while the vacuum pump is in operation during at least one of (a) or (c), and
- wherein the low temperature structure comprises one selected from the group consisting of:
    - a material susceptible to corrosion by the process gas;
    - a structure located in vicinity of a viewport wherethrough an inside of the process vessel is visually recognizable from an outside of the process vessel; and
    - an O-ring provided around the coolant flow path.

20. A substrate processing apparatus configured to be capable of performing the method of claim 19.

* * * * *